US011987687B2

(12) United States Patent
Iwazaki

(10) Patent No.: US 11,987,687 B2
(45) Date of Patent: May 21, 2024

(54) HEAT CONDUCTIVE SHEET

(71) Applicant: SEKISUI POLYMATECH CO., LTD., Saitama (JP)

(72) Inventor: Hiromichi Iwazaki, Kounosu (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 556 days.

(21) Appl. No.: 17/278,420

(22) PCT Filed: Sep. 25, 2019

(86) PCT No.: PCT/JP2019/037554
§ 371 (c)(1),
(2) Date: Mar. 22, 2021

(87) PCT Pub. No.: WO2020/067141
PCT Pub. Date: Apr. 2, 2020

(65) Prior Publication Data
US 2021/0388175 A1 Dec. 16, 2021

(30) Foreign Application Priority Data

Sep. 26, 2018 (JP) .................... 2018-180192

(51) Int. Cl.
| | |
|---|---|
| *C08K 7/06* | (2006.01) |
| *C08K 3/04* | (2006.01) |
| *C08L 83/04* | (2006.01) |
| *C08L 101/16* | (2006.01) |
| C08K 3/08 | (2006.01) |
| C08K 3/22 | (2006.01) |
| C08K 7/08 | (2006.01) |

(52) U.S. Cl.
CPC ............. *C08K 3/042* (2017.05); *C08L 83/04* (2013.01); *C08K 2003/0812* (2013.01); *C08K 2003/2227* (2013.01); *C08K 7/06* (2013.01); *C08K 7/08* (2013.01); *C08K 2201/001* (2013.01)

(58) Field of Classification Search
CPC . C08K 3/042; C08K 7/06; C08K 7/08; C08K 2003/0812; C08K 2003/2227; C08K 2201/001; C08K 3/04; C08K 7/00; C08K 7/02; H01L 23/42; H01L 23/373; H01L 23/3737; H05K 7/20481; C08L 101/16
USPC .......................................... 524/495
See application file for complete search history.

(56) References Cited

U.S. PATENT DOCUMENTS

| | | | | |
|---|---|---|---|---|
| 11,618,247 | B2 * | 4/2023 | Kudoh | .................... B29C 70/62 264/678 |
| 2006/0234056 | A1 | 10/2006 | Huang et al. | |
| 2007/0284366 | A1 * | 12/2007 | Ohta | ..................... H01L 23/373 257/E23.09 |
| 2017/0336535 | A1 * | 11/2017 | Shima | ............... B29D 11/00009 |
| 2018/0186037 | A1 | 7/2018 | Goshima et al. | |
| 2020/0243414 | A1 | 7/2020 | Kudoh | |
| 2021/0130570 | A1 * | 5/2021 | Kudoh | ..................... C08K 3/04 |
| 2022/0289932 | A1 * | 9/2022 | Kudoh | ..................... C08K 3/04 |

FOREIGN PATENT DOCUMENTS

| | | |
|---|---|---|
| CN | 101087511 | 12/2007 |
| CN | 101309576 | 11/2008 |
| CN | 108407425 | 8/2018 |
| JP | 2001-156227 | 6/2001 |
| JP | 2006-335958 | 12/2006 |
| JP | 2007-326976 | 12/2007 |
| JP | 2008-251747 | 10/2008 |
| JP | 2010-254766 | 11/2010 |
| JP | 2011-241403 | 12/2011 |
| JP | 2014-27144 | 2/2014 |
| JP | 2015-73067 | 4/2015 |
| JP | 2016-506 | 1/2016 |
| JP | 2017-27144 | 2/2017 |
| JP | 6178389 | 7/2017 |
| JP | 2017-135137 | 8/2017 |
| JP | 2018-14534 | 1/2018 |
| JP | 2018-56315 | 4/2018 |
| TW | 201830615 | 8/2018 |
| WO | 2016/208458 | 12/2016 |
| WO | 2016/208509 | 12/2016 |
| WO | 2017/018232 | 2/2017 |
| WO | 2017/179318 | 10/2017 |
| WO | 2017/179416 | 10/2017 |

OTHER PUBLICATIONS

English Machine Translation of JP 2018-014534 (Year: 2018).*
International Search Report dated Dec. 17, 2019 in International (PCT) Application No. PCT/JP2019/037554.
International Search Report (ISR) dated Aug. 27, 2019 in International (PCT) Application No. PCT/JP2019/024113.
Extended European Search Report dated Feb. 18, 2022 in European Patent Application No. 19823508.7.

\* cited by examiner

*Primary Examiner* — Hannah J Pak
(74) *Attorney, Agent, or Firm* — Wenderoth, Lind & Ponack, L.L.P.

(57) ABSTRACT

A thermally conductive sheet comprising an anisotropic filler 12 in a polymer matrix 14, wherein the anisotropic filler 12 appears on at least one surface and the at least one surface has an arithmetic mean peak curvature (Spc) of 18000 (1/mm) or less.

8 Claims, 3 Drawing Sheets

HEAT CONDUCTIVE SHEET

TECHNICAL FIELD

The present invention relates to a thermally conductive sheet, and relates to, for example, a thermally conductive sheet to be used by being disposed between a heat-generating element and a heat-dissipating element.

BACKGROUND ART

In electronic devices, such as a computer, an automobile part, and a cellular phone, a heat-dissipating element, such as a heat sink, is generally used for dissipating heat which is generated from a heat-generating element such as a semiconductor element or a mechanical part. It is known that a thermally conductive sheet is disposed between a heat-generating element and a heat-dissipating element for the purpose of enhancing the efficiency of heat transfer to the heat-dissipating element.

A thermally conductive sheet is generally used by being compressed when disposed inside an electronic device, and high flexibility is required in the thermally conductive sheet. Accordingly, a thermally conductive sheet is formed by blending a filler having thermal conductive properties in a polymer matrix having high flexibility, such as rubber or gel. Further, it is widely known that a filler having anisotropy, such as a carbon fiber, is oriented in the thickness direction in a thermally conductive sheet in order to enhance the thermal conductive properties in the thickness direction (see, for example, PTLs 1 and 2).

CITATION LIST

Patent Literature

PTL1: JP 2018-056315 A
PTL2: JP 2018-014534 A

SUMMARY OF INVENTION

Technical Problem

With high functionalization of electric devices, needs for enhancing the properties of a thermally conductive sheet have also been increased and further enhancement of the thermal conductivity in the thickness direction has been desired in recent years. However, as disclosed in PTLs 1 and 2, there is limitation on enhancing the thermal conductivity only by orienting a filler in the thickness direction, and further improvements have been desired.

The present invention has been completed in view of the above problems, and an object of the present invention is to provide a thermally conductive sheet capable of sufficiently improving the thermal conductive properties in the thickness direction.

Solution to Problem

The present inventors have conducted diligent studies in order to solve the above-described problem and as a result, first made an attempt that in a thermally conductive sheet comprising an anisotropic filler such as a carbon fiber, the contact area between the surface of the sheet and the surface of a contact mate, such as a heat-dissipating element, is made large by allowing part of the anisotropic filler to appear on the surface. However, when the thermally conductive sheet is prepared, slicing into a sheet-like form is performed with an edged tool, and if the sheet is made only by performing the slicing, the surface of the sheet is roughened in some cases because of roughening due to the slicing and, besides, appearance of cut surfaces of the carbon fiber and the like on the sliced surface. When the surface of the sheet is roughened, there is a concern that the adhesiveness to the surface of the contact mate is lowered to make a thermal resistance value large.

The present inventors have succeeded to obtain a thermally conductive sheet capable of enhancing the adhesiveness to the surface of the contact mate, thereby reducing the thermal resistance value and sufficiently improving the thermal conductive properties in the thickness direction by polishing the sliced surface to allow the anisotropic filler to appear from the surface of the sheet and to smooth the surface of the sheet in such a way as to reduce the arithmetic mean peak curvature (Spc) to a predetermined value or less, specifically to smooth the surface of the sheet by making the contact points with the surface of the contact mate such as a heat-generating element rounded.

That is the present invention is as described below.

[1] A thermally conductive sheet comprising an anisotropic filler in a polymer matrix, wherein the anisotropic filler appears on at least one surface and the at least one surface has an arithmetic mean peak curvature (Spc) of 18000 (1/mm) or less.

[2] The thermally conductive sheet according to [1], wherein the anisotropic filler is oriented in a thickness direction of the thermally conductive sheet.

[3] The thermally conductive sheet according to [1] or [2], wherein the at least one surface has an arithmetical mean height (Sa) of 20 μm or less.

[4] The thermally conductive sheet according to any one of [1] to [3], wherein a surface (at least one surface) of the thermally conductive sheet has a developed interfacial area ratio (Sdr) of 70 or less.

[5] The thermally conductive sheet according to any one of [1] to [4], wherein the anisotropic thermally conductive filler is at least one of a fibrous filler and a flaky filler.

[6] The thermally conductive sheet according to any one of [1] to [5], having a thickness of 0.1 to 5.0 mm.

[7] The thermally conductive sheet according to [6], having a thickness of 0.1 to 0.3 mm.

Advantageous Effects of Invention

According to the present invention, a thermally conductive sheet capable of sufficiently improving the thermal conductive properties in the thickness direction can be provided.

DESCRIPTION OF EMBODIMENTS

Hereinafter, a thermally conductive sheet according to embodiments of the present invention will be described in detail.

First Embodiment

Figure 1:
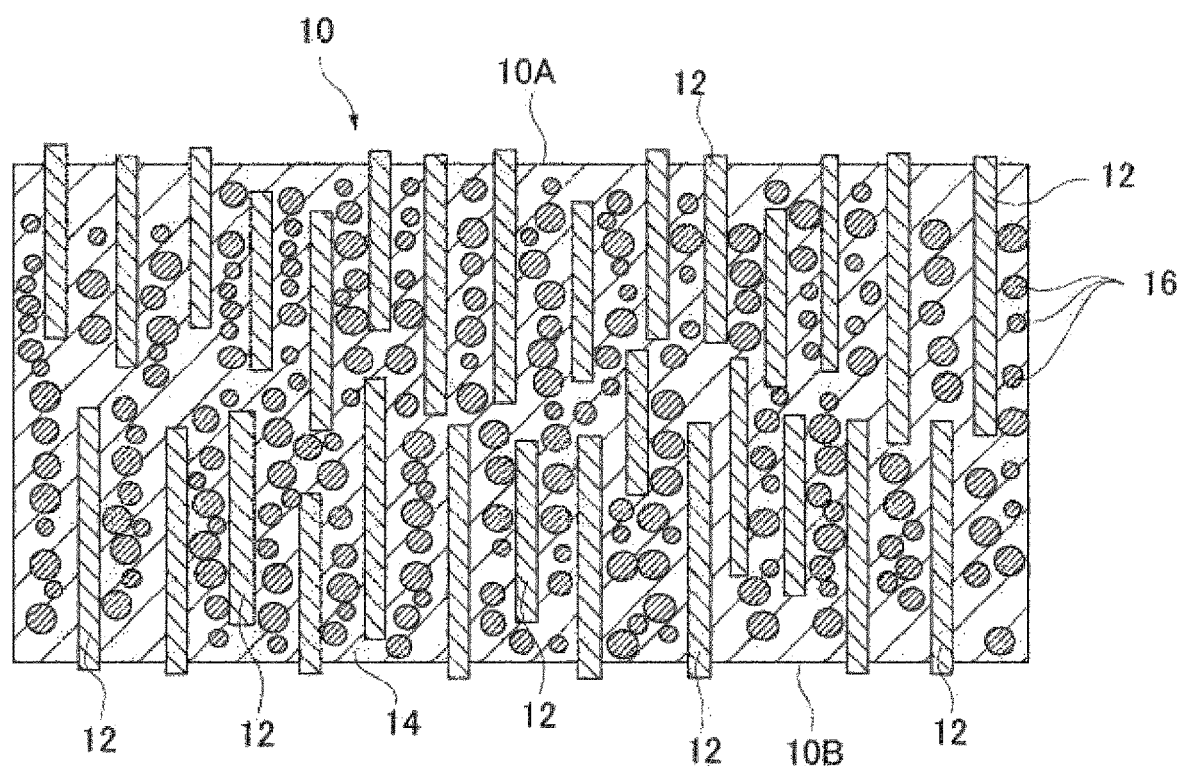
FIG. 1 is a schematic section view showing a thermally conductive sheet of the first embodiment.

FIG. 1 shows a thermally conductive sheet according to one embodiment of the present invention. In FIG. 1, an example of a case where an anisotropic filler is a fiber material is representatively shown.

The thermally conductive sheet 10 according to the present embodiment comprises an anisotropic filler 12 in a polymer matrix 14, wherein the anisotropic filler 12 appears on surfaces 10A, 10B, and the surfaces 10A, 10B have an arithmetic mean peak curvature (Spc) of 18000 (1/mm) or less.

According to the above-described constitution, even in a state in which the anisotropic filler 12 is exposed from the surface 10A of the thermally conductive sheet and the surface 10A of the sheet is uneven, the arithmetic mean peak curvature (Spc) is 18000 (1/mm) or less, and therefore the surface 10A of the sheet has smoothness and the contact area where the surface of the sheet 10A closely adheres to a heat-generating element or the like is made large, so that the thermal resistance value can be reduced. The arithmetic mean peak curvature (Spc) is preferably 17000 (1/mm) or less, and more preferably 16000 (1/mm) or less. The arithmetic mean peak curvature (Spc) is preferably 1000 (1/mm) or more, and more preferably 5000 (1/mm) or more.

The arithmetic mean peak curvature (Spc) is a parameter which is measured in accordance with ISO 25178 and represents the arithmetical mean of principal curvatures of the peaks in a defined region. When this value is small, it shows that the points to be in contact with a heat-generating element or the like are rounded. On the other hand, when this value is large, it shows that the points to be in contact with a heat-generating element or the like are sharp.

The positions of the rounded contact points are not certain, but, for example, an end portion or an end surface of the anisotropic filler exposed on the surface, or a surface composed of an end portion of the anisotropic filler and the surface of the polymer matrix can be a rounded contact point.

The arithmetic mean peak curvature (Spc) can be calculated by measuring the surface profile in a predetermined measurement area (for example, 1 mm² two-dimensional region) with a commercially available laser microscope.

To make the arithmetic mean peak curvature (Spc) 18000 (1/mm) or less, a polishing treatment on the surface may be performed using sandpaper having a grain size of, for example, #120 to 20000 and appropriately setting the number of times of polishing according to the grain size. If necessary, the E hardness of an oriented molding before making it into the thermally conductive sheet 10 is set to about 10 to about 80, and after this oriented molding is sliced into a sheet-like form, the above-described polishing treatment may be performed.

In the thermally conductive sheet 10, the anisotropic filler 12 is preferably oriented in the thickness direction of the thermally conductive sheet 10 at least inside the thermally conductive sheet 10, as shown in FIG. 1. According to the above-described constitution, the thermally conductive sheet which exhibits high thermal conductive properties in the thickness direction of the thermally conductive sheet 10, in which the surface of the sheet is smooth, and which has a low thermal resistance value is made. To orient the anisotropic filler 12, a treatment, such as magnetic field orientation or flow orientation, which will be mentioned later, may be applied.

The state in which the anisotropic filler 12 is oriented in the thickness direction of the thermally conductive sheet 10 herein refers to a state in which the major axis direction of more than 60% of the anisotropic filler 12 in terms of a number percentage faces a direction in a range of within 20° from the thickness direction of the thermally conductive sheet 10. Such a state of orientation can be ascertained by observing a section cut along the thickness direction of the thermally conductive sheet 10 with an electron microscope.

The surface 10A of the thermally conductive sheet 10 preferably has an arithmetical mean height (Sa) of 20 μm or less, and more preferably 1 to 15 μm. When the arithmetical mean height (Sa) is 20 μm or less, the surface of the sheet has smoothness and the contact area where the surface of the sheet closely adheres to a heat-generating element or the like is made large, so that the thermal resistance value can be reduced. The arithmetical mean height (Sa) can be measured utilizing a commercially available surface characteristics measuring apparatus, and can be measured specifically by the method described in Examples.

To make the arithmetical mean height (Sa) 20 μm or less, a polishing treatment on the surface may be performed using sandpaper having, for example, a relatively coarse grain size among various kinds of sandpaper having a grain size of #120 to 20000 and appropriately setting the number of times of polishing according to the grain size.

The surface 10A of the thermally conductive sheet 10 preferably has a developed interfacial area ratio (Sdr) of 70 or less, and more preferably 1 to 60. When the developed interfacial area ratio (Sdr) is 70 or less, the surface of the sheet has smoothness, and the contact area where the surface of the sheet closely adheres to a heat-generating element or the like is made large, so that the thermal resistance value can be reduced even in a state where the thermally conductive filler is exposed from the surface 10A of the thermally conductive sheet 10 and the surface of the sheet is uneven.

The developed interfacial area ratio (Sdr) is an index indicating the amount of an increase in the developed area (surface area) in a defined region relative to the area of the defined region (for example, 1 mm²), and a perfectly flat surface has a developed area ratio Sdr of 0. The developed interfacial area ratio (Sdr) can be measured by the method described in Examples.

To make the developed interfacial area ratio (Sdr) 70 or less, a polishing treatment on the surface may be performed using sandpaper having, for example, a relatively coarse grain size among various kinds of sandpaper having a grain size of #120 to 20000 and appropriately setting the number of times of polishing according to the grain size.

In the present embodiment, the thermally conductive sheet 10 further comprises a non-anisotropic filler 16. The thermally conductive sheet 10, when comprising the non-anisotropic filler 16, makes thermal conductive properties further better. The details on the non-anisotropic filler 16 will be mentioned later.

Hereinafter, the constitution of the thermally conductive sheet according to the present embodiment will be described in more detail.

<Polymer Matrix>

The polymer matrix 14 which is used in the thermally conductive sheet 10 is a polymer compound, such as an elastomer or a rubber, and a product formed by curing a polymer composition (curable polymer composition) in a liquid form, the polymer composition comprising a mixed system such as the one comprising a main agent and a curing agent, may preferably be used. For example, the curable polymer composition may be a composition comprising an uncrosslinked rubber and a crosslinking agent, or a composition comprising: a monomer, a prepolymer, or the like; and a curing agent or the like. The curing reaction may be cold curing or heat curing.

Examples of the polymer matrix 14 which is formed from the curable polymer composition include silicone rubber. In the case of silicone rubber, addition reaction-curable type silicone is preferably used as the polymer matrix (curable polymer composition) 14. More specifically, a curable polymer composition comprising alkenyl group-containing organopolysiloxane and hydrogen organopolysiloxane may be used as the curable polymer composition.

Various synthetic rubbers other than the above-described rubber can be used as the rubber, and specific examples thereof include acrylic rubber, nitrile rubber, isoprene rubber, urethane rubber, ethylene propylene rubber, styrene/butadiene rubber, butadiene rubber, fluororubber, and butyl rubber. When any of these rubbers is used, the synthetic rubber may be crosslinked or left uncrosslinked (that is, uncured) in the thermally conductive sheet. Uncrosslinked rubber is used mainly in flow orientation.

When the synthetic rubber is crosslinked (that is, cured), the polymer matrix may be, as described above, a product obtained by curing a curable polymer composition comprising: an uncrosslinked rubber comprising any of these synthetic rubbers; and a crosslinking agent.

As the elastomer, a thermoplastic elastomer, such as a polyester-based thermoplastic elastomer or a polyurethane-based thermoplastic elastomer, or a heat-curable type elastomer which is formed by curing a polymer composition in a liquid form of a mixed system comprising a main agent and a curing agent can be used. Examples of the elastomer include a polyurethane-based elastomer which is formed by curing a polymer composition comprising: a polymer having a hydroxy group; and isocyanate.

Among those described above, silicone rubber, or particularly addition reaction-curable type silicone is preferably used from the viewpoint that, for example, the polymer matrix after curing is particularly flexible and filling properties of a thermally conductive filler are good.

The polymer composition for forming the polymer matrix may be a polymer composition comprising a single substance of a polymer compound, or may be a polymer composition comprising a polymer compound and a plasticizer. The plasticizer is suitably used when a synthetic rubber is used, and when the plasticizer is contained, the flexibility of the uncrosslinked polymer matrix can thereby be enhanced.

The content of the polymer matrix, when expressed by a filling ratio on a volume basis (volume filling ratio), is preferably 20 to 50% by volume, and more preferably 25 to 45% by volume based on the total amount of the thermally conductive sheet.

(Additive)

In the thermally conductive sheet 10, various additives may further be blended in the polymer matrix 14 in a range where the function as the thermally conductive sheet 10 is not impaired. Examples of the additive include at least one or more selected from a dispersant, a coupling agent, a pressure-sensitive adhesive, a fire retardant, an antioxidant, a coloring agent, an anti-settling agent, and the like. When the curable polymer composition is subjected to crosslinking, curing, or the like, as described above, a crosslinking accelerator, a curing accelerator, or the like that accelerates crosslinking or curing may be blended as an additive.

<Anisotropic Filler>

The anisotropic filler 12 which is blended in the polymer matrix 14 is a filler having anisotropy in the shape and is a filler that can be oriented. The anisotropic filler 12 is preferably a heat-conducting filler. The anisotropic filler 12 is preferably a fibrous filler (for example, fiber material, such as a carbon fiber), a flaky filler (flaky material, such as graphite, graphene, or boron nitride), or the like.

Even in a state in which these anisotropic fillers are exposed on the surface of the thermally conductive sheet 10 and the surface of the sheet is somewhat uneven, the surface of the sheet has good smoothness and the contact area where the surface of the sheet closely adheres to a heat-generating element or the like is made large, so that the thermal resistance value can be reduced more.

The anisotropic filler 12 is a filler having a high aspect ratio and is specifically a filler having an aspect ratio of exceeding 2, and the aspect ratio is preferably 5 or more. Setting the aspect ratio to larger than 2 makes it easy to orient the anisotropic filler in the thickness direction, so that the thermal conductive properties of the thermally conductive sheet 10 are enhanced easily.

The upper limit of the aspect ratio is not particularly limited, but is 100 in practical use.

The aspect ratio refers to a ratio of the length in the major axis direction to the length in the minor axis direction of the anisotropic filler, and means fiber length/diameter of fiber in a fiber material, and length in major axis direction of scale-like material/thickness in a scale-like material.

The anisotropic filler is preferably a fiber material from the viewpoint of enhancing the thermal conductive properties.

The content of the anisotropic filler 12 in the thermally conductive sheet is preferably 30 to 500 parts by mass, and more preferably 50 to 300 parts by mass based on 100 parts by mass of the polymer matrix. The content of the anisotropic filler 12, when expressed by a filling ratio on a volume basis (volume filling ratio), is preferably 5 to 60% by volume, and more preferably 8 to 45% by volume based on the total amount of the thermally conductive sheet.

Setting the content of the anisotropic filler 12 to 30 parts by mass or more makes it easy to enhance the thermal conductive properties, and setting the content to 300 parts by mass or less easily makes the viscosity of the mixed composition, which will be mentioned later, proper, thereby making the orientation of the anisotropic filler 12 good.

When the anisotropic filler 12 is a fiber material, the average fiber length is preferably 50 to 500 nm, and more preferably 70 to 350 nm. When the average fiber length is set to 50 nm or more, the anisotropic fillers come into contact properly inside the thermally conductive sheet 10, so that heat transmission paths are secured.

On the other hand, when the average fiber length is set to 500 nm or less, the bulk of the anisotropic filler 12 is made low, so that the anisotropic filler 12 can be made highly filled in the polymer matrix.

The average fiber length of the fiber material is preferably shorter than the thickness of the thermally conductive sheet 10. When the average fiber length is shorter than the thickness, the fiber material is thereby prevented from protruding from the surfaces of the thermally conductive sheet 10 more than necessary.

When the anisotropic filler 12 is a scale-like material, the average particle diameter is preferably 10 to 400 nm, and more preferably 15 to 200 nm. The average particle diameter is particularly preferably 15 to 130 nm. Setting the average particle diameter to 10 nm or more makes it easy for the anisotropic fillers to come into contact in the thermally conductive sheet, so that heat transmission paths are secured. On the other hand, when the average particle diameter is set to 400 nm or less, the bulk of the thermally conductive sheet 10 is made low, enabling the anisotropic filler 12 to be highly filled in the polymer matrix 14.

The average fiber length of the carbon fiber or the average particle diameter of the flaky material can be calculated from, for example, the fiber length or the major axis obtained by observing the anisotropic filler with a microscope. More specifically, the fiber lengths or major axes of arbitrary 50 anisotropic fillers are measured using, for example, an electron microscope or an optical microscope, and the average value (arithmetical mean value) can be adopted as the average fiber length or the average particle diameter.

A known material having thermal conductive properties may be used as the anisotropic filler 12, but as will be mentioned later, the anisotropic filler 12 preferably has diamagnetism in such a way that the anisotropic filler can be oriented by a magnetic field.

Specific examples of the anisotropic filler 12 include a carbon-based material represented by a carbon fiber or a scale-like carbon powder, a metal material represented by a metal fiber, a metal oxide, boron nitride, a metal nitride, a metal carbide, and a metal hydroxide. A carbon-based material among these has a small specific gravity and good dispersibility into the polymer matrix 14 and is therefore preferable, and, among others, the anisotropic filler is more preferably a graphitized carbon material having a high thermal conductivity. A graphitized carbon material, when having graphite planes uniformly facing a predetermined direction, has diamagnetism. In addition, boron nitride or the like, when having crystal planes uniformly facing in a predetermined direction, also has diamagnetism.

The anisotropic filler 12 has a thermal conductivity of, though not limited to, generally 60 W/m·K or more, and preferably 400 W/m·K or more along a direction of having anisotropy (that is, major axis direction). The anisotropic filler 12 has a thermal conductivity of, for example, 2000 W/m·K or less although the upper limit is not particularly limited. The thermal conductivity can be measured by a laser flash method or a method in accordance with ASTM D5470.

The anisotropic filler 12 may be used singly, or two or more anisotropic fillers 12 may be used together. For example, at least two anisotropic fillers 12 each having a different average particle diameter or average fiber length may be used as the anisotropic filler 12. It is considered that when the anisotropic fillers 12 each having a different size are used, a smaller anisotropic filler 12 gets in between relatively larger anisotropic fillers 12, and thereby the anisotropic fillers 12 can be filled up to high density in the polymer matrix and heat-conducting efficiency can be enhanced.

The carbon fiber which is used as the anisotropic filler 12 is preferably a graphitized carbon fiber. The scale-like carbon powder is preferably a scale-like graphite powder. Among these, the anisotropic filler is more preferably a graphitized carbon fiber.

A graphitized carbon fiber has a high thermal conductivity in its fiber axis direction because crystal planes of graphite run in the fiber axis direction. Therefore, by allowing fiber axis directions of the graphitized carbon fiber to face uniformly in a predetermined direction, the thermal conductivity in a particular direction can be enhanced. The scale-like graphite powder has a high thermal conductivity in its in-plane direction because crystal planes of graphite run in the in-plane direction of the scale plane. Therefore, by allowing scale planes of the scale-like graphite powder to face uniformly in a predetermined direction, the thermal conductivity in a particular direction can be enhanced. The graphitized carbon fiber and the scale-like graphite powder each having a high degree of graphitization are preferable.

As the above-described graphitized carbon materials, such as the graphitized carbon fiber and the scale-like graphite powder, products obtained by graphitizing the following raw materials can be used. Examples thereof include a condensed polycyclic hydrocarbon compound, such as naphthalene, and a condensed heterocyclic compound, such as PAN (polyacrylonitrile) or pitch, and graphitized mesophase pitch having a high degree of graphitization, polyimide, or polybenzazole in particular is preferably used. For example, by using mesophase pitch, the pitch is oriented in the fiber axis direction due to its anisotropy in the spinning step which will be mentioned later, so that a graphitized carbon fiber having excellent thermal conductive properties in the fiber axis direction can be obtained.

The graphitized carbon fiber obtained such that, to raw materials, treatments of spinning, infusibilization, and carbonization are conducted in sequence, and pulverization or cutting is conducted to a predetermined particle diameter, and thereafter graphitization is conducted, or the graphitized carbon fiber such that carbonization is conducted, pulverization or cutting is then conducted, and thereafter graphitization is conducted can be used. When pulverization or cutting is conducted before graphitization, a condensation polymerization and a cyclization reaction progress easily on a surface newly exposed due to pulverization during the graphitization treatment, and therefore a graphitized carbon fiber having thermal conductive properties further improved by enhancing the degree of graphitization can be obtained. When, on the other hand, pulverization is conducted after graphitizing a spun carbon fiber, the carbon fiber after graphitization is rigid and therefore is easily pulverized, so that a carbon fiber powder having a relatively narrow fiber length distribution can be obtained by brief pulverization.

<Non-Anisotropic Filler>

The non-anisotropic filler 16 is a thermally conductive filler contained in the thermally conductive sheet 10 separately from the anisotropic filler 12 and is a material which, together with the anisotropic filler 12, imparts thermal conductive properties to the thermally conductive sheet 10. In the present embodiment, by filling the non-anisotropic filler 16, an increase in the viscosity is suppressed, making the dispersibility good in the stage prior to curing into a sheet. In addition, in the anisotropic fillers 12, when, for example, the fiber length is large, it is difficult to increase the contact area between the fillers, but when the non-anisotropic filler 16 fills the space between the anisotropic fillers, heat transfer paths can thereby be formed, so that the thermally conductive sheet 10 having a high thermal conductivity is obtained.

The non-anisotropic filler 16 is a filler whose shape is substantially free of anisotropy, and is a filler such that even in an environment where the anisotropic filler 12 is oriented in a predetermined direction, such as an environment, which will be mentioned later, where lines of magnetic force are generated or shear force is applied, the non-anisotropic filler 16 is not oriented in the predetermined direction.

The non-anisotropic filler 16 has an aspect ratio of 2 or less, and preferably 1.5 or less. In the present embodiment, when the non-anisotropic filler having such a low aspect ratio is contained, the filler having thermal conductive properties is thereby properly interposed in the space between the anisotropic fillers 12, so that the thermally conductive sheet 10 having a high thermal conductivity is obtained. In addition, by setting the aspect ratio to 2 or less, an increase in the viscosity of the mixed composition which will be mentioned later is prevented, enabling the thermally conductive sheet to be highly filled.

Specific examples of the non-anisotropic filler 16 include a metal, a metal oxide, a metal nitride, a metal hydroxide, a carbon material, and an oxide, a nitride, and a carbide other than the metal oxide, the metal nitride, and a metal carbide. Examples of the shape of the non-anisotropic filler include a spherical shape and an indefinite-form powder.

In the non-anisotropic filler 16, examples of the metal include aluminum, copper, and nickel, examples of the metal oxide include aluminum oxide (alumina), magnesium oxide, and zinc oxide, and examples of the metal nitride include aluminum nitride. Examples of the metal hydroxide include aluminum hydroxide. Examples of the carbon material include spheroidal graphite. Examples of the oxide, the nitride, and the carbide other than the metal oxide, the metal nitride, and the metal carbide include quartz, boron nitride, and silicon carbide.

Among these described above, the non-anisotropic filler 16 is preferably selected from the group consisting of alumina, aluminum, zinc oxide, boron nitride, and aluminum nitride, aluminum and alumina in particular is preferable from the viewpoint of filling properties and thermal conductivity, and alumina is more preferable.

As the non-anisotropic filler 16, those described above may be used singly, or two or more of those described above may be used together.

The average particle diameter of the non-anisotropic filler 16 is preferably 0.1 to 50 μm, and more preferably 0.5 to 35 μm. The average particle diameter is particularly preferably 1 to 15 μm. By setting the average particle diameter to 50 μm or less, a defect such as disturbing the orientation of the anisotropic filler 12, or the like is made unlikely to occur. By setting the average particle diameter to 0.1 μm or more, the specific surface area of the non-anisotropic filler 16 is not made larger than needed, making the viscosity of the mixed composition unlikely to increase even when a large amount is blended and making it easy to highly fill the non-anisotropic filler 16.

With respect to the non-anisotropic filler 16, for example, at least two non-anisotropic fillers 16 each having a different average particle diameter may be used as the non-anisotropic filler.

The average particle diameter of the non-anisotropic filler 16 can be measured by observation with an electron microscope or the like. More specifically, the particle diameters of arbitrary 50 non-anisotropic fillers are measured using, for example, an electron microscope or an optical microscope, and the average value (arithmetical mean value) can be adopted as the average particle diameter. Alternatively, the average particle diameter is a volume average particle diameter of the particle size distribution measured by a laser diffraction scattering method (JIS R1629).

The content of the non-anisotropic filler 16 is preferably in a range of 200 to 800 parts by mass, and more preferably in a range of 300 to 700 parts by mass based on 100 parts by mass of the polymer matrix.

The content of the non-anisotropic filler 16, when expressed by a filling ratio on a volume basis (volume filling ratio), is preferably 30 to 60% by volume, and more preferably 40 to 55% by volume based on the total amount of the thermally conductive sheet.

By setting the content of the non-anisotropic filler to 200 parts by mass or more, the amount of the non-anisotropic filler 16 interposed in the space between the anisotropic filler 12 is made sufficient, making the thermal conductive properties good. On the other hand, by setting the content to 800 parts by mass or less, an effect of enhancing the thermal conductive properties corresponding to the content can be obtained, and the heat conduction due to the anisotropic filler 12 is not inhibited by the non-anisotropic filler 16. Further, by setting the content within the range of 300 to 700 parts by mass, the thermal conductive properties of the thermally conductive sheet 10 are made excellent and the viscosity of the mixed composition is made suitable.

The ratio of the volume filling ratio of the non-anisotropic filler 16 to the volume filling ratio of the anisotropic filler is preferably 2 to 5, and more preferably 2 to 3. By setting the range of the proportion of the volume filling ratios to the above-described range, the non-anisotropic filler 16 is filled moderately between the anisotropic fillers, so that efficient heat transfer paths can be formed, and therefore the thermal conductive properties of the thermally conductive sheet 10 can be improved.

<Thermally Conductive Sheet>

The thermal resistance value in the thickness direction of the sheet of the thermally conductive sheet 10 is preferably less than 1° C./W, more preferably 0.5° C./W or less, and still more preferably 0.2° C./W or less. Setting the thermal resistance value to a certain value or less in this way makes it easy for the thermally conductive sheet 10 to transmit heat from a heat-generating element to a heat-dissipating element. The thermal resistance value is better when it is smaller, but is usually 0.01° C./W or more. The thermal resistance value can be measured by the method described in Examples.

The thermal conductivity in the thickness direction of the thermally conductive sheet 10 is, for example, set to 5 W/m·K or more, preferably 10 W/m·K or more, more preferably 15 W/m·K or more, and still more preferably 18 W/m·K or more. By setting the thermal conductivity in the thickness direction to these lower limit values or more, the thermal conductive properties in the thickness direction of the thermally conductive sheet 10 can be made excellent. The upper limit is not particularly set, the thermal conductivity in the thickness direction of the thermally conductive sheet 10 is, for example, 50 W/m·K or less. The thermal conductivity is measured by a method in accordance with ASTM D5470-06.

The anisotropic filler 12 is exposed on the surfaces as described above, thereby making each of the surfaces of the thermally conductive sheet 10 a non-pressure-sensitive adhesive surface.

Each of the surfaces which is a non-pressure-sensitive adhesive surface is unlikely to adhere when it is touched by a hand of a worker, and is easily peeled when it adheres by pressure to an object of contact, such as a heat-generating element or a heat-dissipating element which will be mentioned later, or the like. Since each of the surfaces is non-adhesive, the thermally conductive sheet 10 can be slid when it is mounted on an electronic device or the like.

The thickness of the thermally conductive sheet 10 is considered to be used in a range of 0.1 to 5.0 mm, but does not need to be limited to the thickness range. The thickness is appropriately changed according to the shape and intended use of an electronic device on which the thermally conductive sheet 10 is loaded, but a more preferred thickness is 0.1 to 0.3 mm. When the thickness is 0.1 to 0.3 mm, the thermally conductive sheet is a thin film to be a thermally conductive sheet which easily transfers heat.

The thermally conductive sheet 10 is used inside an electronic device or the like. Specifically, the thermally conductive sheet is interposed between a heat-generating element and a heat-dissipating element, transfers heat generated at the heat-generating element to a heat-dissipating element by heat conduction, and dissipates heat from the heat-dissipating element. Examples of the heat-generating element herein include various electronic parts, such as CPU, a power amplifier, and a power source such as a battery, which are used inside an electronic device. Examples of the heat-dissipating element include a heat sink, a heat pipe, a heat pump, and a metal housing of an electronic device. The thermally conductive sheet is used in such a way that the surfaces closely adhere to a heat-generating element and a heat-dissipating element, respectively and the thermally conductive sheet is compressed.

<Method for Producing Thermally Conductive Sheet>

The thermally conductive sheet of the present embodiment can be produced by, for example, a method comprising the following steps (A), (B) and (C) although the method is not particularly limited thereto.

Step (A): a step of obtaining an oriented molding such that an anisotropic filler is oriented along a direction to be a thickness direction in the thermally conductive sheet Step (B): a step of cutting the oriented molding into a sheet-like form to obtain a sheet-like molding Step (C): a step of polishing a surface of the sheet-like molding Hereinafter, each step will be described in more detail.

[Step (A)]

In the step (A), for example, an oriented molding is molded from a mixed composition comprising: an anisotropic filler; a non-anisotropic filler; and a polymer composition to be a raw material for a polymer matrix. The mixed composition is preferably cured into an oriented molding. More specifically, the oriented molding can be obtained by a production method by magnetic field orientation or a production method by flow orientation, but among these, the production method by magnetic field orientation is preferable.

(Production Method by Magnetic Field Orientation)

In the production method by magnetic field orientation, the mixed composition comprising: a polymer composition in a liquid form to be a polymer matrix after curing; an anisotropic filler; and a non-anisotropic filler is injected inside a die or the like and is then placed in a magnetic field to orient the anisotropic filler along the magnetic field, and the polymer composition is thereafter cured, thereby obtaining an oriented molding. The oriented molding is preferably molded into a block-like form.

A release film may be disposed at a portion which is to be in contact with the mixed composition inside the die. As the release film, for example, a resin film having good releasability, or a resin film such that one surface is release-treated with a release agent or the like is used. Using a release film makes it easy to release the oriented molding from the die.

The viscosity of the mixed composition which is used in the production method by magnetic field orientation is preferably 10 to 300 Pa·s in order to subject the anisotropic filler to magnetic field orientation. By setting the viscosity to 10 Pa·s or more, the anisotropic filler and the non-anisotropic filler are made unlikely to settle. By setting the viscosity to 300 Pa·s or less, the fluidity is made good, the anisotropic filler is oriented properly in the magnetic field, and a defect such as taking too much time for orientation does not occur. The viscosity refers to viscosity measured using a rotational viscometer (Brookfield viscometer DV-E, Spindle SC4-14) at a rotational speed of 10 rpm at 25° C.

However, when an anisotropic filler and a non-anisotropic filler which are unlikely to settle are used, or an additive, such as an anti-settling agent, is combined, the viscosity of the mixed composition may be set to less than 10 Pa·s.

Examples of a source for generating lines of magnetic force, the source for applying the lines of magnetic force, in the production method by magnetic field orientation include a superconducting magnet, a permanent magnet, and an electromagnet, and a superconducting magnet is preferable from the viewpoint that a magnetic field with a high magnetic flux density can be generated. The magnetic flux density of the magnetic field which is generated from these sources for generating lines of magnetic force is preferably 1 to 30 tesla. Setting the magnetic flux density to 1 tesla or more enables the above-described anisotropic filler comprising a carbon material and the like to be oriented easily. Setting the magnetic flux density to 30 tesla or less enables practical production.

Curing of the polymer composition may be conducted by heating, and may be conducted at a temperature of, for example, about 50 to about 150° C. The heating time is, for example, about 10 minutes to about 3 hours.

(Production Method by Flow Orientation)

In the production method by flow orientation, shear force may be applied to the mixed composition to produce a preliminary sheet such that the anisotropic filler is oriented in the plane direction, a plurality of the preliminary sheets may be laminated to produce a laminated block, and the laminated block may be used as the oriented molding.

More specifically, in the production method by flow orientation, an anisotropic filler, a non-anisotropic filler, and if necessary, various additives are first mixed with the polymer composition to stir a resultant mixture, thereby preparing a mixed composition in which mixed solid substances are uniformly dispersed. The polymer compound which is used for the polymer composition may be a polymer compound comprising a polymer compound in a liquid form at normal temperature (23° C.) or may be a polymer compound comprising a polymer compound in a solid form at normal temperature. Further, the polymer composition may comprise a plasticizer.

The mixed composition has a relatively high viscosity such that shear force is applied when the mixed composition is stretched into a sheet-like form, and specifically, the viscosity of the mixed composition is preferably 3 to 50 Pa·s. A solvent is preferably blended in the mixed composition in order to obtain the viscosity.

Next, the mixed composition is molded into a sheet-like form (preliminary sheet) by stretching flatly while shear force is given to the mixed composition. By applying the shear force, the anisotropic filler can be oriented in the shear direction. With respect to means for molding the sheet, a base film may be coated with the mixed composition, for example, with an applicator for application, such as a bar coater or a doctor blade, or by extrusion molding or ejection from a nozzle, and thereafter, drying may be conducted or the mixed composition may be semi-cured as necessary. The thickness of the preliminary sheet is preferably set to about 50 to about 250 µm. In the preliminary sheet, the anisotropic filler is oriented in a direction along the plane direction of the sheet.

Subsequently, a plurality of the preliminary sheets may be stacked and laminated in such a way that the orientation directions are the same, and thereafter the preliminary sheets may be allowed to adhere to one another with a heat press or the like while the mixed composition is cured as necessary by heating, irradiation with an ultraviolet ray, or the like to form a laminated block, and the laminated block may be used as the oriented molding.

[Step (B)]

In the step (B), the oriented molding obtained in the step (A) is cut by slicing or the like perpendicularly to a direction of the orientation of the anisotropic filler, thereby obtaining a sheet-like molding. The slicing may be conducted with, for example, a shearing blade and laser. In the sheet-like molding, an edge of the anisotropic filler is exposed from the polymer matrix on each surface which is a section by cutting, such as slicing. Further, at least part of the exposed anisotropic filler protrudes from each surface. Almost all the exposed anisotropic fillers are oriented in the thickness direction without falling down.

The oriented molding herein preferably has a type E hardness specified in JIS K6253 of 10 to 80, and more preferably 20 to 70. When the E hardness is 10 to 80, the polymer matrix is more positively cut than the anisotropic filler in slicing the sheet-like molding and the anisotropic filler can easily be exposed. The anisotropic filler can also be exposed by molding the thermally conductive sheet through slicing and then polishing the surface because the polymer matrix is worn more easily than the anisotropic filler. Further, when the anisotropic filler is worn in an exposed state, the end portion of the exposed anisotropic filler is crushed to make it easy to form the end portion having a shape such that the end portion is swollen in the surface direction of the thermally conductive sheet, and the contact area with an adherend is increased due to the end portion, so that the heat-conducting properties can be enhanced more.

[Step (C)]

In the step (C), the surface of the sheet-like molding, on which the anisotropic filler is exposed, is polished. The polishing of the surface may be conducted using, for example, sandpaper, a polishing film, a polishing cloth, and a polishing belt. In the present production method, polishing the surface of the sheet-like molding allows the anisotropic filler to appear on the surface and makes the arithmetic mean peak curvature (Spc) 18000 (1/mm) or less.

Accordingly, sandpaper having, for example, an average grain diameter (D50) of contained abrasive grains of 0.1 to 100 μm as a characteristic of the sandpaper is preferable, and sand paper more preferably has an average grain diameter of contained abrasive grains of 9 to 60 μm. By using sandpaper having an average grain diameter of 0.1 μm or more, the anisotropic filler appears from the surface of the sheet, and the surface of the sheet can be smoothed in such a way as to reduce the arithmetic mean peak curvature (Spc) to a predetermined value or less, specifically, the contact points with the surface of the contact mate, such as a heat-generating element, is rounded, thereby enabling the smoothing. By using sandpaper having an average grain diameter of 100 μm or less, damage to be a practical problem is prevented from occurring on the surface of the thermally conductive sheet. From the reason similar to that described above, the particle size of abrasive grains of sandpaper for example is preferably #120 to 20000, preferably #300 to 15000, and more preferably #320 to 4000.

As the polishing method, a method in which, for example, polishing is conducted by allowing sandpaper to abut on the surface of the thermally conductive sheet continuously in the same linear direction, polishing is conducted by reciprocating sandpaper on the surface of the thermally conductive sheet within a certain distance, polishing is conducted by rotating sandpaper in the same direction on the surface of the thermally conductive sheet, or polishing is conducted by allowing sandpaper to abut on the surface of the thermally conductive sheet in various directions can be used.

With respect to the extent of polishing, the polishing may be conducted, for example, while the surface state is being observed, but in the case of reciprocation polishing for example, 1 to 300 times of reciprocation is preferable, more preferably 2 to 200 times, and still more preferably 3 to 50 times, and specifically, polishing is preferably conducted to such an extent that the protruding length of the anisotropic filler becomes 100 μm or less. Further, polishing is more preferably conducted to such an extent that the protruding length becomes 50 μm or less.

In the above description, an aspect such that the anisotropic filler 12 is exposed on the surfaces 10A, 10B of the thermally conductive sheet 10, the anisotropic filler 12 appears on the surfaces 10A, 10B, and the surfaces 10A, 10B have an arithmetic mean peak curvature (Spc) of 18000 (1/mm) or less is shown. However, in the present invention, the thermally conductive sheet may be such that the anisotropic filler 12 appears on only one of the surfaces 10A, 10B.

Accordingly, the other one of the surfaces 10A, 10B is such that the anisotropic filler 12 appears thereon, and the arithmetic mean peak curvature (Spc) is 18000 (1/mm) or less, or may be such that the anisotropic filler 12 appears thereon but the arithmetic mean peak curvature (Spc) is set in such a way as not to be 18000 (1/mm) or less. In this case, the polishing by the step (C) is conducted on only one of the surfaces, and the polishing is not conducted on the other surface, or if polishing is performed on the other surface, the polishing may be performed under a condition other than the condition indicated in the above-described step (C).

The polished surface closely adheres to a heat-generating element or a heat-dissipating element and is extremely flat before being compressed and used, and the surface characteristics after compression is slightly flattened as compared to those before the compression and is almost the same as those before the compression. In contrast, the unpolished surface is greatly flattened by compression in some cases but cannot be flattened to the level equal to that of the polished surface.

The other one of the surfaces 10A, 10B may be a surface such that the anisotropic filler 12 has been buried inside the polymer matrix 12. The outermost surface of the oriented molding produced by the above-described production method by magnetic field orientation is a skin layer in which the proportion of the anisotropic filler filled is lower than that of the other portions, typically in which the anisotropic filler is not contained. Accordingly, by using, for example, the outermost surface of the oriented molding as the other one of the surfaces 10A, 10B of the thermally conductive sheet 10, the other one of the surfaces 10A, 10B can be made into a surface such that the anisotropic filler 12 has been buried inside the polymer matrix 12. The surface such that the anisotropic filler 12 has been buried inside the polymer matrix 12 is a pressure-sensitive adhesive surface. The pressure-sensitive adhesive surface adheres to an object of contact, such as a heat-dissipating element or a heat-generating element, and the object of contact can thereby be fixed.

Second Embodiment

Next, a thermally conductive sheet of the second embodiment of the present invention will be described with reference to FIG. 2.

Figure 2:
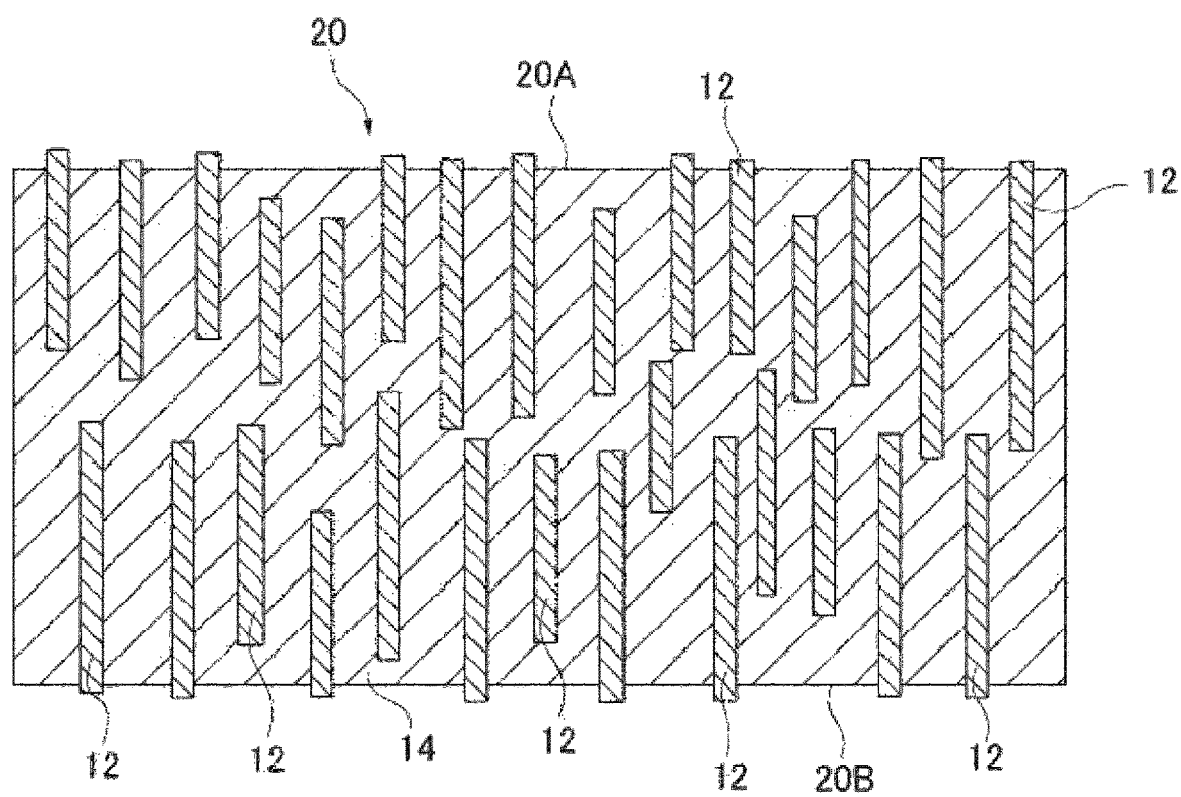
FIG. 2 is a schematic section view showing a thermally conductive sheet of the second embodiment.

In the first embodiment, the non-anisotropic filler 16 is contained as the filler in addition to the anisotropic filler 12 in the thermally conductive sheet 10, but a non-anisotropic filler 16 is not contained in a thermally conductive sheet 20 of the present embodiment, as shown in FIG. 2. That is, in the thermally conductive sheet of the second embodiment, only a carbon fiber, for example, may be used as a filler.

The other constitution of the thermally conductive sheet 20 of the second embodiment is the same as that of the above-described thermally conductive sheet 10 of the first embodiment, except that the non-anisotropic filler is not contained, and therefore the description is omitted.

Also, in the present embodiment, the constitution is such that the anisotropic filler 12 is exposed on at least one of the surfaces 20A, 20B of the thermally conductive sheet 20 in the same manner as in the first embodiment, so that the same effect as that of the first embodiment is obtained.

Also, in the present embodiment, the anisotropic filler 12 appears on at least one surface, and the at least one surface has an arithmetic mean peak curvature (Spc) of 18000 (1/mm) or less, and the thermal conductive properties in the thickness direction can thereby be improved in the same manner as in the first embodiment.

EXAMPLES

Hereinafter, the present invention will be described with reference to Examples in more detail, but the present invention is not limited at all by these Examples.

In the present Examples, the physical properties of the thermally conductive sheets were evaluated by the following methods.

[Arithmetic Mean Peak Curvature (Spc), Arithmetical Mean Height (Sa), Developed Interfacial Area Ratio (Sdr)]

Surface characteristics analysis using a laser microscope (VK-X150, manufactured by KEYENCE CORPORATION) was performed in accordance with ISO 25178. Specifically, a surface profile of a two-dimensional region having a surface area of 1000 μm×1000 μm was measured with a lens of 10 magnifications by a laser method. The average value obtained by measurement at three points in the same sample was adopted as the arithmetic mean peak curvature Spc.

Measurement for the arithmetical mean height (Sa) and the developed interfacial area ratio (Sdr) as well as the arithmetic mean peak curvature (Spc) was performed at three points in the same sample, and the average values of those were adopted as the arithmetical mean height (Sa) and the developed interfacial area ratio (Sdr), respectively.

[Thermal Resistance Value]

Figure 3:
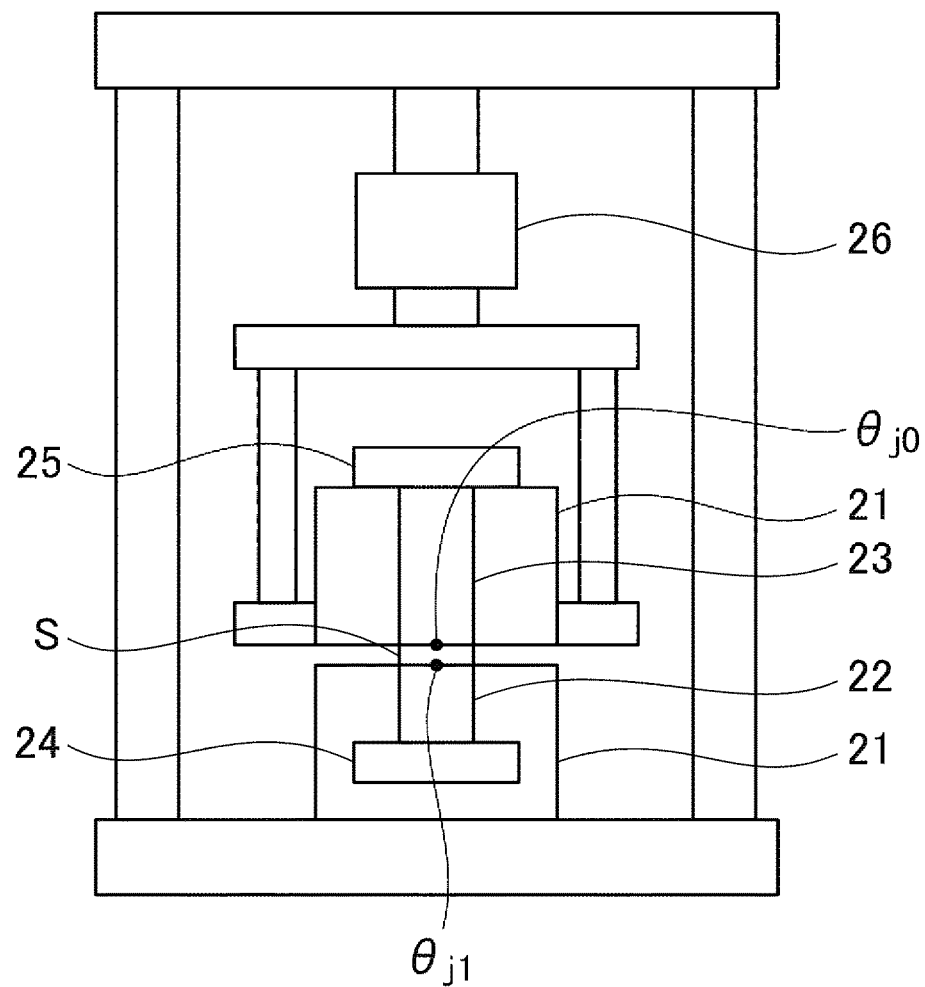
FIG. 3 is an outline diagram of a thermal resistance measuring machine.

The thermal resistance value was measured using a thermal resistance measuring machine as shown in FIG. 3 by the method described below.

Specifically, a test piece S having a size of 30 mm×30 mm for the present test was prepared for each sample. Each test piece S was pasted on a copper block 22 such that a measurement face has a size of 25.4 mm×25.4 mm and side faces are covered with a thermal insulator 21, and was held between the copper block and an upper copper block 23, and load was applied with a load cell 26 to set the thickness in such a way as to become 90% of the original thickness. The lower copper block 22 is in contact with a heater 24. The upper copper block 23 is covered with the thermal insulator 21 and is connected to a heat sink 25 with a fan. Subsequently, the heater 24 was heated by a calorific value of 25 W, and 10 minutes later when the temperature would reach an almost stationary state, the temperature of the upper copper block 23 (ed, the temperature of the lower copper block 22 ($\theta_{j1}$), and the calorific value of the heater (Q) were measured to determine the thermal resistance value of each sample from the following expression (1).

$$\text{Thermal resistance} = (\theta_{j1} - \theta_{j0})/Q \qquad \text{Expression (1)}$$

wherein $\theta_{j1}$ represents the temperature of the lower copper block 22, $\theta_{j0}$ represents the temperature of the upper copper block 23, and Q represents the calorific value.

[Type E Hardness Specified in JIS K6253]

The type E hardness was measured based on JIS K 6253 which is a Japanese industrial standard. Specifically, measurement was performed using a type E durometer on the oriented moldings prepared in the respective examples.

[Orientation Rate]

A section of each thermally conductive sheet prepared was observed with an electron microscope to extract 100 anisotropic fillers (carbon fibers) to determine the number of the anisotropic fillers oriented in the thickness direction of the sheet in 100 anisotropic fillers. The thermally conductive sheet in which 61 anisotropic fillers (61%) or more are oriented was rated as good, and the thermally conductive sheet in which less than 60 anisotropic fillers (60%) were oriented was rated as poor.

The thermally conductive sheet in which the major axis direction of the carbon fiber faces a direction in a range of within 20° from the thickness direction of the thermally conductive sheet was decided as oriented.

Example 1

A mixed composition was obtained by mixing: alkenyl group-containing organopolysiloxane and a hydrogen organopolysiloxane (100 parts by mass in total, volume filling ratio of 36% by volume) as the polymer matrix (polymer composition); 150 parts by mass (volume filling ratio of 30% by volume) of a carbon fiber (a graphitized carbon fiber of average fiber length of 100 μm, aspect ratio of 10, thermal conductivity of 500 W/m·K) as the anisotropic filler; and 200 parts by mass (volume filling ratio of 18% by volume) of an alumina powder (spherical, average particle diameter of 3 μm, aspect ratio of 1.0) and 100 parts by mass (volume filling ratio of 13% by volume) of an aluminum powder (indefinite form, average particle diameter of 3 μm) as the non-anisotropic filler.

Subsequently, the mixed composition was injected into a die whose thickness was set in such a way as to be sufficiently larger than that of each thermally conductive sheet, a magnetic field of 8T was applied in the thickness direction to orient the carbon fiber in the thickness direction, and the matrix was thereafter cured by heating at 80° C. for 60 minutes, thereby obtaining a block-like oriented molding.

Next, the block-like oriented molding was sliced into a sheet-like form having a thickness of 1 mm using a shearing blade, thereby obtaining a sheet-like molding such that the carbon fiber is exposed.

Subsequently, a thermally conductive sheet was obtained by conducting reciprocation polishing 50 times on each surface of the sheet-like molding with rough sandpaper A (grain size of #320) having an average grain diameter (D50) of abrasive grains of 60 μm.

Example 2

A thermally conductive sheet was obtained in the same manner as in Example 1, except that sandpaper A was changed to sandpaper B (grain size of #4000) having finer abrasive grains having an average grain diameter (D50) of 3 μm, and the number of times of polishing was changed to 15 times of reciprocation.

Example 3

A thermally conductive sheet was obtained in the same manner as in Example 1, except that sandpaper A was changed to sandpaper C (grain size of #15000) having further finer abrasive grains having an average grain diameter (D50) of 0.3 μm, and the number of times of polishing was changed to 3 times of reciprocation.

Example 4

A thermally conductive sheet was obtained in the same manner as in Example 1, except that 50 times of reciprocation polishing with sandpaper A was changed to 30 times of reciprocation polishing with sandpaper A followed by 10 times of reciprocation polishing with sandpaper B and 10 times of further reciprocation polishing with sandpaper C.

Comparative Example 1

A thermally conductive sheet was obtained in the same manner as in Example 1, except that the sheet-like molding was not polished.

Example 5

A mixed composition was obtained by mixing: an alkenyl group-containing organopolysiloxane and a hydrogen organopolysiloxane (100 parts by mass in total, volume filling ratio of 32% by volume) as the polymer matrix (polymer composition); 150 parts by mass (volume filling ratio of 26% by volume) of a carbon fiber (graphitized carbon fiber having an average fiber length of 100 μm, an aspect ratio of 10, and a thermal conductivity of 500 W/m·K) as the anisotropic filler; and 475 parts by mass (volume filling ratio of 41% by volume) of an alumina powder (spherical, average particle diameter of 3 μm, aspect ratio of 1.0) as the non-anisotropic filler.

Subsequently, the mixed composition was injected into a die whose thickness was set in such a way as to be sufficiently larger than that of the thermally conductive sheet, a magnetic field of 8T was applied in the thickness direction to orient the carbon fiber in the thickness direction, and the matrix was thereafter cured by heating at 80° C. for 60 minutes, thereby obtaining a block-like oriented molding.

Next, the block-like oriented molding was sliced into a sheet-like form having a thickness of 1 mm using a shearing blade, thereby obtaining a sheet-like molding such that the carbon fiber is exposed.

Subsequently, a thermally conductive sheet was obtained by subjecting each surface of the sheet-like molding to 30 times of reciprocation polishing with sandpaper A having coarse abrasive grains.

Example 6

A thermally conductive sheet was obtained in the same manner as in Example 5, except that sandpaper A was changed to sand paper B having finer abrasive grains, and the number of times of polishing was changed to 15 times of reciprocation.

Example 7

A thermally conductive sheet was obtained in the same manner as in Example 5, except that sandpaper A was changed to sand paper C having further finer abrasive grains, and the number of times of polishing was changed to 5 times of reciprocation.

Example 8

A thermally conductive sheet was obtained in the same manner as in Example 5, except that 50 times of reciprocation polishing with sandpaper A was changed to 30 times of reciprocation polishing with sandpaper A followed by 10 times of reciprocation polishing with sandpaper B and 10 times of further reciprocation polishing with sandpaper C.

Comparative Example 2

A thermally conductive sheet was obtained in the same manner as in Example 5, except that the sheet-like molding was not polished.

Previously mentioned measurement and evaluation were performed on the sheet-like moldings or the thermally conductive sheets prepared in respective examples. The results are shown in Table 1 below.

TABLE 1

| | | Example 1 | Example 2 | Example 3 | Example 4 | Comparative Example 1 | Example 5 | Example 6 | Example 7 | Example 8 | Comparative Example 2 |
|---|---|---|---|---|---|---|---|---|---|---|---|
| Material constitution (parts by mass) | Polymer matrix | 100 | 100 | 100 | 100 | 100 | 100 | 100 | 100 | 100 | 100 |
| | Carbon fiber | 150 | 150 | 150 | 150 | 150 | 150 | 150 | 150 | 150 | 150 |
| | Alumina | 200 | 200 | 200 | 200 | 200 | 475 | 475 | 475 | 475 | 475 |
| | Aluminum | 100 | 100 | 100 | 100 | 100 | — | — | — | — | — |
| Characteristics | Spc(1/mm) | 5936 | 14196 | 17489 | 3380 | 19620 | 5486 | 8830 | 15687 | 2784 | 20950 |
| | Sa(μm) | 8.2 | 13.9 | 18.2 | 7.5 | 21.4 | 5.4 | 8.6 | 11.3 | 4.1 | 20.5 |
| | Sdr | 9.8 | 46.3 | 67.8 | 5.5 | 79.3 | 8.2 | 25.4 | 55.8 | 5.4 | 81.6 |
| | Type E hardness | 35 | 35 | 35 | 35 | 35 | 50 | 50 | 50 | 50 | 50 |
| | Orientation rate | Good | Good | Good | Good | Good | Good | Good | Good | Good | Good |
| Evaluation result | Thermal resistance value (° C./W) | 0.04 | 0.07 | 0.08 | 0.03 | 0.16 | 0.05 | 0.11 | 0.13 | 0.04 | 0.22 |

Example 9

A mixed composition was obtained by mixing: an alkenyl group-containing organopolysiloxane and a hydrogen organopolysiloxane (100 parts by mass in total, volume filling ratio of 36% by volume) as the polymer matrix (polymer composition); 140 parts by mass (volume filling ratio of 28% by volume) of a carbon fiber (graphitized carbon fiber having an average fiber length of 100 μm, an aspect ratio of 10, and a thermal conductivity of 500 W/m·K) and 5 parts by mass (volume filling ratio of 1% by volume) of graphite (a flaky graphite powder having an average particle diameter of 130 μm, an aspect ratio of 10, and a thermal conductivity of 550 W/m·K) as the anisotropic filler; and 250 parts by mass (volume filling ratio of 34% by volume) of an aluminum powder (indefinite form, average particle diameter of 3 μm) as the non-anisotropic filler.

Subsequently, the mixed composition was injected into a die whose thickness was set in such a way as to be sufficiently larger than that of the thermally conductive sheet, a magnetic field of 8T was applied in the thickness direction to orient the carbon fiber in the thickness direction, and the matrix was thereafter cured by heating at 80° C. for 60 minutes, thereby obtaining a block-like oriented molding.

Next, the block-like oriented molding was sliced into a sheet-like form having a thickness of 1 mm using a shearing blade, thereby obtaining a sheet-like molding such that the carbon fiber is exposed.

Subsequently, a thermally conductive sheet was obtained by subjecting each surface of the sheet-like molding to 50 times of reciprocation polishing with rough sandpaper A (grain size of #320) having an average grain diameter (D50) of abrasive grains of 60 μm.

Example 10

A thermally conductive sheet was obtained in the same manner as in Example 9, except that sandpaper A was changed to sand paper B (grain size of #4000) having finer abrasive grains having an average grain diameter (D50) of 3 μm, and the number of times of polishing was changed to 15 times of reciprocation.

Example 11

A thermally conductive sheet was obtained in the same manner as in Example 9, except that sandpaper A was changed to sand paper C (grain size of #15000) having further finer abrasive grains having an average grain diameter (D50) of 0.3 μm, and the number of times of polishing was changed to 3 times of reciprocation.

Example 12

A thermally conductive sheet was obtained in the same manner as in Example 9, except that 50 times of reciprocation polishing with sandpaper A was changed to 30 times of reciprocation polishing with sandpaper A followed by 10 times of reciprocation polishing with sandpaper B and 10 times of further reciprocation polishing with sandpaper C.

Comparative Example 3

A thermally conductive sheet was obtained in the same manner as in Example 9, except that the sheet-like molding was not polished.

Example 13

A mixed composition was obtained by mixing: an alkenyl group-containing organopolysiloxane and a hydrogen organopolysiloxane (100 parts by mass in total, volume filling ratio of 36% by volume) as the polymer matrix (polymer composition); 150 parts by mass (volume filling ratio of 30% by volume) of a carbon fiber (graphitized carbon fiber having an average fiber length of 100 μm, an aspect ratio of 10, and a thermal conductivity of 500 W/m·K) as the anisotropic filler; and 250 parts by mass (volume filling ratio of 33% by volume) of an aluminum powder (indefinite form, average particle diameter of 3 μm) as the non-anisotropic filler.

Subsequently, the mixed composition was injected into a die whose thickness was set in such a way as to be sufficiently larger than that of the thermally conductive sheet, a magnetic field of 8T was applied in the thickness direction to orient the carbon fiber in the thickness direction, and the matrix was thereafter cured by heating at 80° C. for 60 minutes, thereby obtaining a block-like oriented molding.

Next, the block-like oriented molding was sliced into a sheet-like form having a thickness of 1 mm using a shearing blade, thereby obtaining a sheet-like molding such that the carbon fiber is exposed.

Subsequently, a thermally conductive sheet was obtained by subjecting each surface of the sheet-like molding to 30 times of reciprocation polishing with sandpaper A having coarse abrasive grains.

Example 14

A thermally conductive sheet was obtained in the same manner as in Example 13, except that sandpaper A was changed to sand paper B having finer abrasive grains, and the number of times of polishing was changed to 15 times of reciprocation.

Example 15

A thermally conductive sheet was obtained in the same manner as in Example 13, except that sandpaper A was changed to sand paper C having further finer abrasive grains, and the number of times of polishing was changed to 5 times of reciprocation.

Example 16

A thermally conductive sheet was obtained in the same manner as in Example 13, except that 50 times of reciprocation polishing with sandpaper A was changed to 30 times of reciprocation polishing with sandpaper A followed by 10 times of reciprocation polishing with sandpaper B and 10 times of further reciprocation polishing with sandpaper C.

Comparative Example 4

A thermally conductive sheet was obtained in the same manner as in Example 13, except that the sheet-like molding was not polished.

Previously mentioned measurement and evaluation were performed on the sheet-like moldings or the thermally conductive sheets prepared in respective examples. The results are shown in Table 2 below.

TABLE 2

| | | Example 9 | Example 10 | Example 11 | Example 12 | Comparative Example 3 | Example 13 | Example 14 | Example 15 | Example 16 | Comparative Example 4 |
|---|---|---|---|---|---|---|---|---|---|---|---|
| Material constitution (parts by mass) | Polymer matrix | 100 | 100 | 100 | 100 | 100 | 100 | 100 | 100 | 100 | 100 |
| | Carbon fiber | 140 | 140 | 140 | 140 | 140 | 150 | 150 | 150 | 150 | 150 |
| | Graphite | 5 | 5 | 5 | 5 | 5 | — | — | — | — | — |
| | Aluminum | 250 | 250 | 250 | 250 | 250 | 250 | 250 | 250 | 250 | 250 |
| Characteristics | Spc(1/mm) | 5685 | 9568 | 16870 | 1779 | 22510 | 6517 | 9187 | 16238 | 1352 | 21200 |
| | Sa(μm) | 8.9 | 8.8 | 15.3 | 3.8 | 23.5 | 6.3 | 9.3 | 12.1 | 4.5 | 22.7 |
| | Sdr | 7.9 | 26.3 | 62.6 | 2.3 | 91.7 | 10.4 | 29.6 | 56.9 | 1.2 | 83.2 |
| | Type E hardness | 50 | 50 | 50 | 50 | 50 | 50 | 50 | 50 | 50 | 50 |
| | Orientation rate | Good | Good | Good | Good | Good | Good | Good | Good | Good | Good |
| Evaluation result | Thermal resistance value (° C./W) | 0.05 | 0.11 | 0.15 | 0.04 | 0.19 | 0.05 | 0.12 | 0.14 | 0.03 | 0.24 |

As is clear from the results of the Examples, when the anisotropic filler appears on the surface and the arithmetic mean peak curvature (Spc) is 18000 (1/mm) or less in the thermally conductive sheet, a desired thermal resistance value and a desired thermal conductivity can thereby be obtained, so that the thermal conductive properties in the thickness direction can be improved. On the other hand, a desired thermal resistance value and a desired thermal conductivity cannot be obtained in the Comparative Examples, so that the thermal conductive properties in the thickness direction cannot be improved sufficiently.

REFERENCE SIGNS LIST 10, 20 Thermally conductive sheet
12 Anisotropic filler
14 Polymer matrix
21 Thermal insulator
22 Lower copper block
23 Upper copper block
24 Heater
25 Heat sink
26 Load cell
S Test piece
$\theta_{j0}$ Temperature of upper copper block
$\theta_{j1}$ Temperature of lower copper block

The invention claimed is:

1. A thermally conductive sheet comprising an anisotropic filler in a polymer matrix, wherein the anisotropic filler appears on at least one surface of the thermally conductive sheet and the at least one surface has an arithmetic mean peak curvature (Spc) of 18000 (1/mm) or less,
   wherein a surface of the thermally conductive sheet has a developed interfacial area ratio (Sdr) of 70 or less.
2. The thermally conductive sheet according to claim 1, wherein the anisotropic filler is oriented in a thickness direction of the thermally conductive sheet.
3. The thermally conductive sheet according to claim 1, wherein the at least one surface has an arithmetical mean height (Sa) of 20 μm or less.
4. The thermally conductive sheet according to claim 1, wherein the anisotropic filler is at least one selected from the group consisting of a fibrous filler and a flaky filler.
5. The thermally conductive sheet according to claim 1, wherein the thermally conductive sheet has a thickness of 0.1 to 5.0 mm.
6. The thermally conductive sheet according to claim 5, wherein the thermally conductive sheet has a thickness of 0.1 to 0.3 mm.
7. The thermally conductive sheet according to claim 1, wherein the polymer matrix is formed from a curable polymer composition.
8. The thermally conductive sheet according to claim 1, wherein the polymer matrix is a crosslinked rubber.

* * * * *